(12) United States Patent
Hong et al.

(10) Patent No.: US 10,097,103 B2
(45) Date of Patent: Oct. 9, 2018

(54) POWER CONVERSION MODULE WITH PARALLEL CURRENT PATHS ON BOTH SIDES OF A CAPACITOR

(71) Applicant: Delta Electronics (Shanghai) CO., LTD, Shanghai (CN)

(72) Inventors: Shouyu Hong, Shanghai (CN); Juan Cheng, Shanghai (CN); Tao Wang, Shanghai (CN); Zhenqing Zhao, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 0 days.

(21) Appl. No.: 15/704,118

(22) Filed: Sep. 14, 2017

(65) Prior Publication Data
US 2018/0076728 A1   Mar. 15, 2018

(30) Foreign Application Priority Data

Sep. 14, 2016  (CN) .......................... 2016 1 0826033

(51) Int. Cl.
| | |
|---|---|
| *H02M 7/00* | (2006.01) |
| *G06F 1/30* | (2006.01) |
| *H02J 9/06* | (2006.01) |
| *H02M 1/10* | (2006.01) |
| *H02M 7/48* | (2007.01) |
| *H01L 25/11* | (2006.01) |
| *H05K 1/02* | (2006.01) |

(52) U.S. Cl.
CPC .............. *H02M 7/003* (2013.01); *G06F 1/30* (2013.01); *H02J 9/061* (2013.01); *H02M 1/10* (2013.01); *H02M 7/48* (2013.01); *H01L 25/115* (2013.01); *H05K 1/025* (2013.01)

(58) Field of Classification Search
CPC ...... H02M 7/003; H05K 1/025; H05K 1/0253
See application file for complete search history.

(56) References Cited

U.S. PATENT DOCUMENTS

| | | | | |
|---|---|---|---|---|
| 6,064,578 A | * | 5/2000 | Hashimoto | H02M 7/003 363/16 |
| 2014/0183550 A1 | * | 7/2014 | Reusch | H05K 1/0231 257/76 |
| 2015/0171764 A1 | * | 6/2015 | Ujita | H02M 7/003 363/132 |

* cited by examiner

*Primary Examiner* — Harry Behm
(74) *Attorney, Agent, or Firm* — Yunling Ren

(57) ABSTRACT

The disclosure relates to a power conversion module, including: a substrate including a routing layer and an insulating layer, the routing layer including a first routing area and a second routing area; an electronic device provided on the first routing area and electrically connected to the first routing area and the second routing area, respectively; a vertical type power device provided on the second routing area and electrically connected to the second routing area; and a capacitor provided on the substrate, disposed between the electronic device and the vertical type power device, and electrically connected to the electronic device and the vertical type power device, respectively. The power conversion module is provided with all devices on the same substrate, thus cost is reduced, yield rate and reliability are improved, and parasitic inductance inside the power conversion module can be reduced.

17 Claims, 17 Drawing Sheets

US 10,097,103 B2

POWER CONVERSION MODULE WITH PARALLEL CURRENT PATHS ON BOTH SIDES OF A CAPACITOR

CROSS REFERENCE

This application is based upon and claims priority to Chinese Patent Application No. 201610826033.0, filed on Sep. 14, 2016, the entire contents thereof are incorporated herein by reference.

TECHNICAL FIELD

The disclosure relates to power electronic technical field and, particularly, to a power conversion module.

BACKGROUND

A large rate of current change is usually generated in the circuit of power switching devices in power electronic conversion apparatuses during the process of switching. Moreover, a relatively high voltage spike may be generated in the power switching devices due to presence of parasitic inductance, and the greater the parasitic inductance, the higher the voltage spike. Excessive voltage spike may reduce reliability of the power switching devices and increase switching losses of the power switching devices. Therefore, requirements are proposed in design of the power electronic conversion apparatuses on how to reduce the parasitic inductance in the circuit. Reduced parasitic inductance in the circuit may alleviate the voltage spike that power switching devices bear as well as allow improved efficiency by using smaller driving resistors in the power switching devices with faster switching speed and lower switching loss.

The magnitude of the parasitic inductance in the circuit is related to package and connection pattern of the power switching device. Accordingly, the parasitic inductance of the circuit is conventionally reduced by reducing a loop area including the power switching device, through inductance cancelling and the like.

FIG. 1A illustrates a circuit diagram of a two-level topology circuit in a conventional power electronic device, FIG. 1B illustrates a top view of a power conversion module corresponding to the two-level topology circuit shown in FIG. 1A, and FIG. 1C illustrates a cross sectional view of the power conversion module corresponding to the two-level topology circuit shown in FIG. 1A. As shown in FIG. 1A, in the two-level circuit, the power switching devices S1 and S2 are vertical IGBTs, which are respectively connected in anti-parallel with diodes D1 and D2. A drain of the power switching device S1 is electrically connected to an end of a capacitor C where a positive input end Vbus+ is led out. A drain of the power switching device S2 is electrically connected to a source of the power switching device S1 where an AC end is led out. A source of the power switching device S2 is electrically connected to the other end of the capacitor C where a negative input Vbus− is led out. Finally, a two-level bridge arm is thus formed. As shown in FIGS. 1B and 1C, the module includes a first substrate 4 consisting of a conductive layer 1, an insulating layer 2 and a conductive layer 3, and a second substrate 9 consisting of a conductive layer 6, an insulating layer 7 and a conductive layer 8. The conductive layer 3 is electrically connected to the conductive layer 6 via conductive material (not shown). The power switching devices S1, S2, the diodes D and D2 are arranged on the conductive layer 3, and the capacitor C is arranged on the conductive layer 8. The bonding wire 11 is configured for electrical connection between the power devices S1, S2, D1 and D2 and the capacitor C. In actual operation of the module, a first loop is formed by the power switching device S1, the diode D2 and the capacitor C, in which a direction of current flowing through the conductive layer 3 is opposite to a direction of current flowing through the conductive layer 8, so the parasitic inductance of the first loop may be reduced. Moreover, a second loop is formed by the power switching device S2, the diode D1, and the capacitor C, in which a direction of current flowing through the conductive layer 3 is opposite to a direction of current flowing through the conductive layer 8 and, likewise, the parasitic inductance of the second loop may be reduced.

However, the power conversion module has the following technical limitations.

(1) an additional second substrate 9, other than the first substrate 4, is required as the carrier plate for the capacitor C, causing an increase in cost;
(2) the difficulty of process (such as spray tin, etc.) increases, resulting in yield loss;
(3) reliability may be reduced due to multiple reflow soldering;
(4) the structure of two substrates may also increase a height of the module, and increase a size of the module, further leading to deteriorate in parasitic inductance due to the increase of pin height.

The above-mentioned information disclosed in this section is only for the purpose of enhancing the understanding of background related to the disclosure and, thus, it may include information which does not constitute prior art known to those of ordinary skill in the art.

SUMMARY

In view of above, the present disclosure provides a power conversion module including all devices arranged on the same substrate, thus cost is reduced, yield rate and reliability are improved, and parasitic inductance inside the power conversion module can be reduced.

Additional aspects and advantages of the disclosure will be set forth in part in the description which follows and, in part, will be obvious from the description, or may be learned by practice of the disclosure.

According to an aspect of the disclosure, there is provided a power conversion module, including: a substrate including a routing layer and an insulating layer, the routing layer including a first routing area and a second routing area; an electronic device provided on the first routing area and electrically connected to the first routing area and the second routing area, respectively; a vertical type power device provided on the second routing area and electrically connected to the second routing area; and a capacitor provided on the substrate, disposed between the electronic device and the vertical type power device, and electrically connected to the electronic device and the vertical type power device, respectively; wherein a first current path and a second current path are formed in the second routing area, respectively, on both sides of the capacitor, being parallel to each other and having a same current direction; a third current path is formed between the electronic device, the capacitor and the vertical type power device, and the third current path is parallel to the first current path and the second current path with an opposite current direction.

According to the power conversion module of the present disclosure, it is possible to reduce the package parasitic inductance of the commutation circuit consisting of the devices S1, S2 and the capacitor C. The parasitic inductance of the package structure corresponding to the power conversion module 10 is simulated by using an electromagnetic field simulation tool Q3D extractor provided by Ansys™ Corp., which is smaller than the circuit parasitic inductance in the conventional package structure under the same simulation conditions. In addition, the power conversion module of the present disclosure eliminates the need for additional substrates for carrying capacitor and, thus, the cost, module height, and module size are reduced, Furthermore, as the power density is improved, and the height of lead-out pins is reduced, the parasitic inductance and loss are further minished. In addition, it also has the advantages of low process difficulty and high reliability due to elimination of multiple reflow soldering.

It is to be understood that both the foregoing general description and the following detailed description are exemplary only and are not restrictive of the disclosure.

BRIEF DESCRIPTION OF THE DRAWINGS

The above and other features and advantages of the present disclosure will become more apparent by describing in detail exemplary embodiments thereof with reference to the accompanying drawings.

DETAILED DESCRIPTION

Figure 1A:
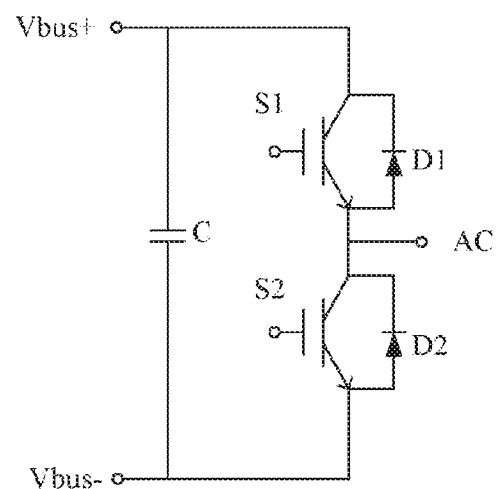
FIG. 1A illustrates a circuit diagram of a two-level topology circuit in a conventional power electronic device.
Figure 1B:
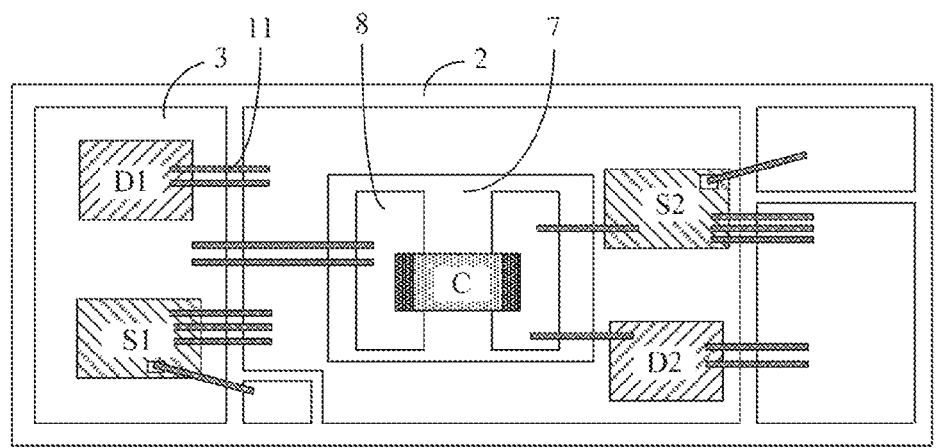
FIG. 1B illustrates a top view of a power conversion module corresponding to the two-level topology circuit shown in FIG. 1A.
Figure 1C:
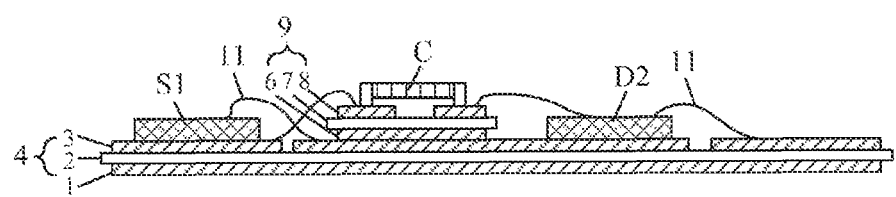
FIG. 1C illustrates a cross sectional view of the power conversion module corresponding to the two-level topology circuit shown in FIG. 1A.

Exemplary embodiments will now be described more fully with reference to the accompanying drawings. However, the exemplary embodiments can be embodied in many forms and should not be construed as limited to the embodiments set forth herein; rather, these embodiments are provided so that this disclosure will be made thorough and complete, and the concept of exemplary embodiments will be fully conveyed to those skilled in the art. Thicknesses of any area or layer are exaggerated in the drawings for purpose of clarity. Same or similar structures are denoted by same reference numbers in the drawings and, thus, a detailed description thereof will be omitted.

Furthermore, the described features, structures, or characteristics may be combined in any suitable manner in one or more embodiments. In the following description, numerous specific details are provided to provide a thorough understanding of the embodiments of the disclosure. Those skilled in the art will recognize, however, that the technical solution of the present disclosure may be practiced without one or more of the specific details described, or that other methods, components, materials, etc. may be employed. In other instances, well-known structures, materials, or operations are not shown or described in detail to avoid obscuring aspects of the disclosure.

Figure 2A:
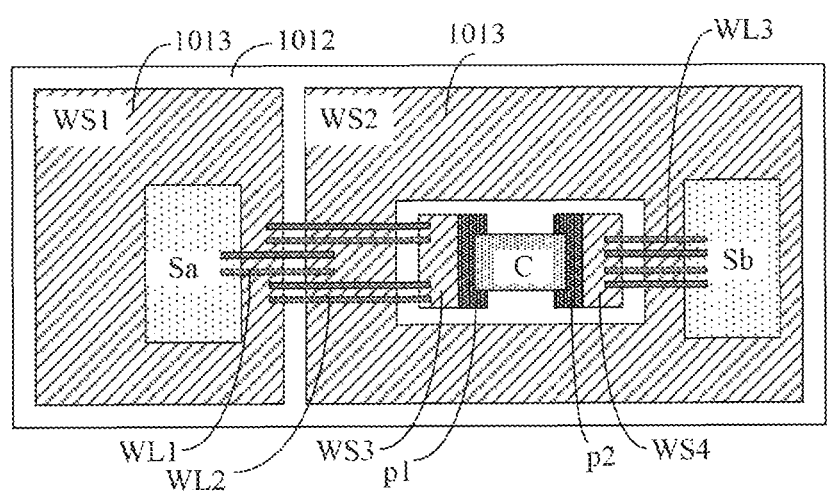
FIGS. 2A and 2B illustrate, respectively, a top view and a cross sectional view of a power conversion module according to an exemplary embodiment.
Figure 2B:
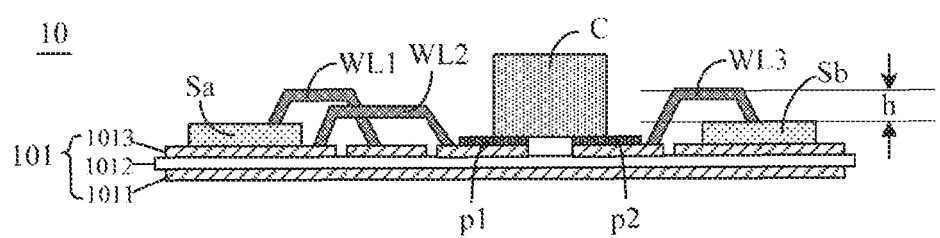

FIGS. 2A and 2B illustrate, respectively, a top view and a cross sectional view of a power conversion module according to an exemplary embodiment. As shown in FIG. 2A, the power conversion module 10 includes a substrate 101, an electronic device Sa, a vertical type power device Sb, and a capacitor C. In an embodiment, the vertical type power device Sb is a controllable switching device, such as MOSFET, IGBT and the like. The electronic device Sa may be, for example, a vertical type power device, a resistor, a capacitor, an inductor, a diode or the like according to the function of the power conversion module 10, and the present disclosure is not limited thereto.

Herein, the substrate 101 serves as a mounting board for the electronic device Sa, the vertical type power device Sb and the capacitor C, and includes at least one insulating layer and at least one conductive layer. The substrate 101 may be, for example, a single/double sided DBC (Direct Bonding Copper) substrate, but the present disclosure is not limited thereto. It may be, for example, single/double sided metallized ceramic substrates, HTCC/LTCC (High/Low Temperature Co-fired Ceramic) substrate and the like.

Taking a double sided DBC substrate as an example, as shown in FIGS. 2A and 2B, the substrate 101 includes a first conductive layer 1011, an insulating layer 1012, and a second conductive layer 1013. In an embodiment, the first conductive layer 1011 and the second conductive layer 1013 may be a copper layer, and the insulating layer 1012 may be a ceramic layer. The insulating layer 1012 is disposed above the first conductive layer 1011, the second conductive layer 1013 is disposed above the insulating layer 1012, and a horizontal area of the insulating layer 1012 is slightly larger than the first conductive layer 1011 and the second conductive layer 1013. The second conductive layer 1013 forms a routing layer of the substrate 101, and the routing layer includes a first routing area WS1 and a second routing area WS2.

The vertical type power device Sb is disposed on the second routing area WS2 and electrically connected to the second routing area WS2. The vertical type power device Sb generally includes an upper surface electrode and a lower surface electrode, and the lower surface electrode is electrically connected to the second routing area WS2 via a connecting material to realize an electrical and mechanical connection between the vertical type power device Sb and the substrate 101. Moreover, a connection line between the lower surface electrode and the upper surface electrode of the vertical type power device Sb is perpendicular to the second routing area WS2. The electronic device Sa is disposed on the first routing area WS1 and electrically connected to the second routing area WS2. The electronic device Sa may include a first electrode and a second electrode.

The capacitor C is disposed on the substrate 101. FIGS. 2A and 2B schematically illustrate a mechanical and electrical connection between the capacitor C and the substrate 101. It is to be noted that the capacitor C may be provided on the substrate 101 in other forms, and the present disclosure is not limited thereto. As shown in FIG. 2E, the capacitor C may be connected to the routing area of the substrate 101 via wires. The capacitor C may be fixed to the insulating layer 1012 of the substrate 101 by means of a fixing material M (e.g. an adhesive or the like), and connecting wires WL4 and WL5 are connected to the solderable pads pad1, pad2 of the capacitor, respectively. Through this connection manner, routing area of the capacitor C can be saved and, thus, the routing area corresponding to the vertical type power device Sb can be increased, so that the heat dissipation is facilitated.

Referring again to FIGS. 2A and 2B, the routing layer of the substrate 101 further includes a third routing area WS3 and a fourth routing area WS4. The capacitor C includes a first terminal and a second terminal (which are respectively located on a side where the capacitor C is connected to the substrate 101 and, thus, are not shown in the figure), and the first terminal and the second terminal are electrically connected to the third routing area WS3 and the fourth routing area WS4, respectively, via connecting materials p1 and p2 (e.g., solder). The capacitor C is disposed between the electronic device Sa and the vertical type power device Sb and is electrically connected to the electronic device Sa and the vertical type power device Sb.

Generally, the electrical connection between the electronic device Sa, the capacitor C and the vertical type power device Sb will be described hereinafter with reference to the case where a connection line between both electrodes of the electronic device Sa is also perpendicular to the substrate. As shown in FIGS. 2A and 2B, the first electrode of the electronic device Sa is electrically connected to the first routing area WS1 via the connecting material, and the first routing area WS1 is electrically connected to the third routing area WS3 via the second wire WL2, thereby the first electrode of the electronic device Sa and the first terminal of the capacitor C are electrically connected. The second electrode of the electronic device Sa is electrically connected to the second routing area WS2 via the first wire WL1, and the lower surface electrode of the vertical type power device Sb is electrically connected to the second routing area WS2 via the connecting material, so that electrical connection is achieved between the second electrode of the electronic device Sa and the lower surface electrode of the vertical type power device Sb. The upper surface electrode of the vertical type power device Sb is electrically connected to the fourth routing area WS4 via the third wire WL3 and, thereby, electrically connected to the second terminal of the capacitor C. The first wire WL1, the second wire WL2, and the third wire WL3 may be, for example, wire bonding or copper foil, and the present disclosure is not limited thereto. The connecting material between the first electrode and the first routing area as well as between the lower surface electrode and the second routing area are not shown in the drawings, but may be a solder or the like, and the present disclosure is not limited thereto.

Figure 2C:
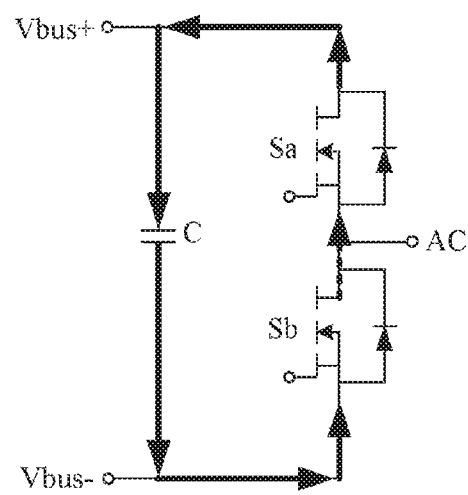
FIGS. 2C and 2D illustrate, respectively, a circuit diagram and a schematic diagram of a current flow direction corresponding to the power conversion module 10 shown in FIG. 2A.
Figure 2D:
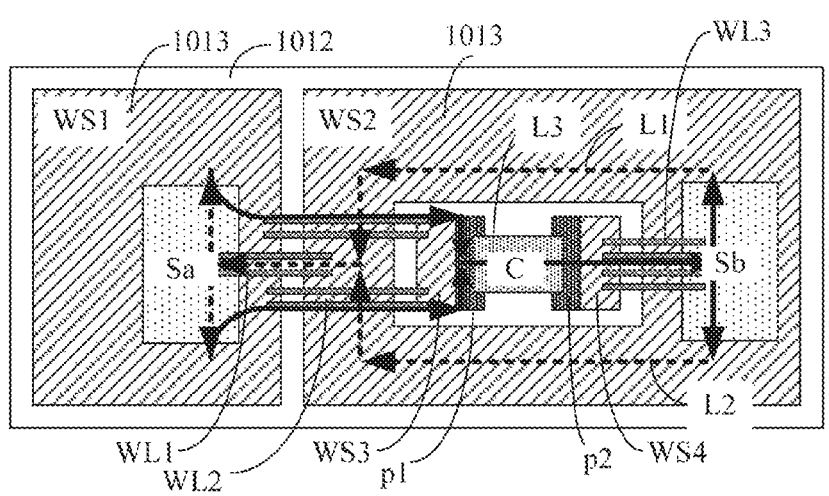
Figure 2E:
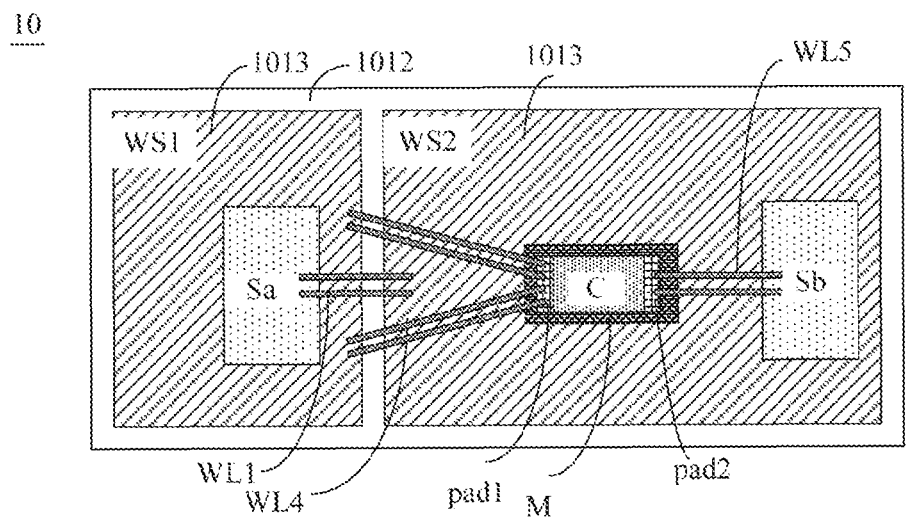
FIG. 2E is a schematic diagram illustrating another connection manner between the capacitor and the substrate according to an exemplary embodiment.
Figure 2F:
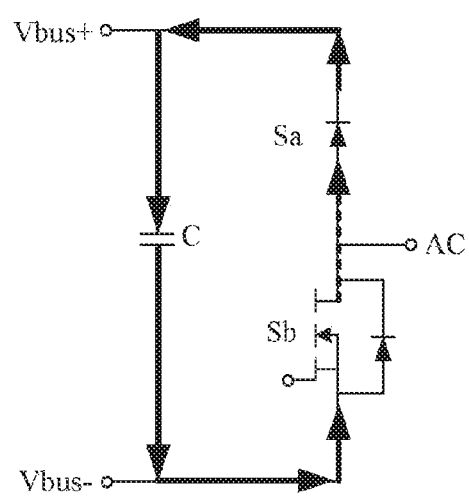
FIG. 2F is another circuit diagram corresponding to the power conversion module according to another exemplary embodiment.

FIGS. 2C and 2D illustrate, respectively, a circuit diagram and a schematic diagram of a current flow direction corresponding to the power conversion module 10 shown in FIG. 2A. In the circuit diagram as shown by FIG. 2C, it is taken for an example that both the electronic device Sa and the vertical type power device Sb are vertical type MOSFETs. As shown in FIG. 2F, in other embodiments, Sa may also be a diode and also exhibits a current flow direction as shown in FIG. 2D.

As shown in FIG. 2C, the solid line arrows illustrate a current path flowing from the first electrode of the electronic device Sa through the capacitor C and flowing to the upper surface electrode of the vertical type power device Sb, while the dotted line arrows illustrate a current path flowing from the lower surface electrode of the vertical type power device Sb to the second electrode of the electronic device Sa. Referring to FIG. 2D, in the power conversion module 10, on both sides of the capacitor C, a first current path L1 and a second current path L2 are formed in the second routing area WS2, respectively. The first current path L1 and the second current path L2 are parallel to each other and have the same current direction, and may correspond to at least a part of the current path shown by the dotted line arrows in FIG. 2C. Furthermore, a third current path L3 is formed between the first electrode of the electronic device Sa, the capacitor C, and the upper surface electrode of the vertical type power device Sb, and may correspond to at least a part of the current path shown by the solid line arrows in FIG. 2C. The third current path L3 is parallel to the first and second current paths L1 and L2 and has a current direction opposite thereto, thereby reducing the parasitic inductance in the circuit of the power conversion module 10, and then reducing the voltage spike during the switching process of power device. In addition, the current flowing through the first wire WL1 and the current flowing through the second wire WL2 are also opposite to each other, which may also serve to reduce the parasitic inductance of the circuit, thereby reducing the voltage spike during the switching process of power device.

In the power conversion module according to the embodiments of the present disclosure, the package parasitic inductance of the commutating circuit consisting of the devices S1, S2 and the capacitor C can be reduced. The parasitic inductance of the package structure corresponding to the power conversion module 10 is simulated by using an electromagnetic field simulation tool Q3D extractor provided by Ansys™ Corp., from which the circuit parasitic inductance of commutating circuit is extracted and is smaller than a circuit parasitic inductance in the conventional package structure under the same simulation conditions.

In addition, the power conversion module according to the embodiments of the present disclosure eliminates the need for an additional substrate for carrying capacitors, so costs can be saved, module height, module size as well as pin height can be reduced, power density can be improved and, thereby the parasitic inductance and loss can be further reduced. Moreover, it also has the advantages of low process difficulty and high reliability due to elimination of multiple reflow soldering. In some embodiments, reducing the height of each wire (e.g., the height h in FIG. 2B) may also increase the degree in which the circuit parasitic inductance is cancelled, thereby reducing the circuit parasitic inductance.

It should be clearly understood that the present disclosure describes how to form and use specific examples, but the principles of the present disclosure are not limited to any detail of these examples. Rather, these principles can be applied to many other embodiments based on the teachings of the present disclosure.

Figure 3:
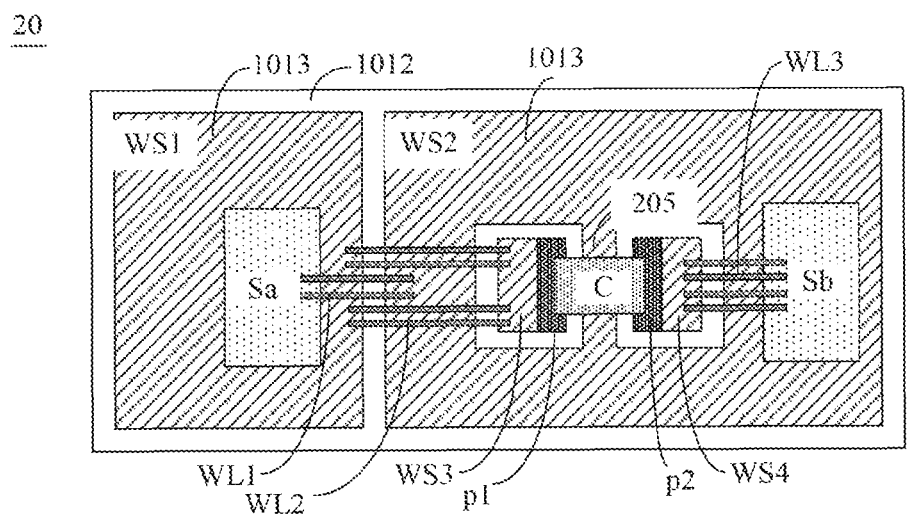
FIG. 3 illustrates a top view of a power conversion module according to another exemplary embodiment.

FIG. 3 illustrates a top view of a power conversion module according to another exemplary embodiment. The power conversion module 20 shown in FIG. 3 differs from the power conversion module 10 shown in FIG. 2A in that the second routing area WS2 further includes a vertical routing 205 below the capacitor C, so as to increase heat dissipation and flow area of the semiconductor device. The vertical routing 205 is located between the third routing area WS3 and the fourth routing area WS4. Moreover, simulation results of the simulation tool Q3D extractor show that the circuit parasitic inductance generated by this structure is slightly smaller than the circuit parasitic inductance of the power conversion module 10 shown in FIG. 2A.

Figure 4:
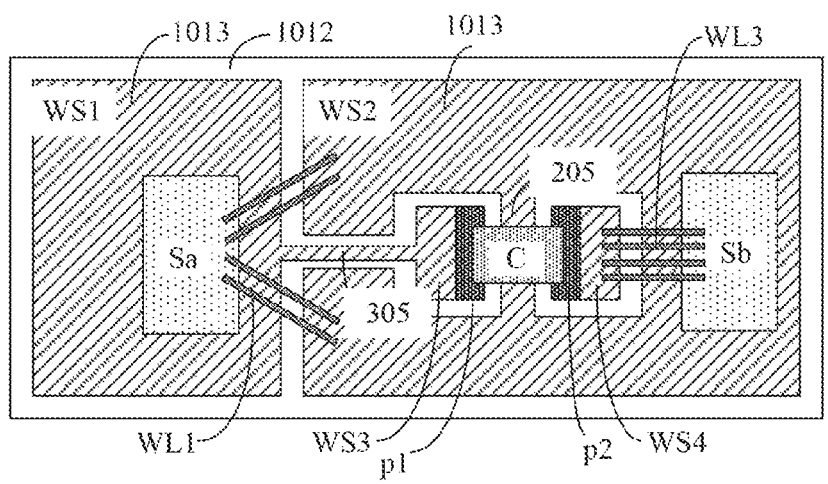
FIG. 4 illustrates a top view of a power conversion module according to yet another exemplary embodiment.

FIG. 4 illustrates a top view of a power conversion module according to yet another exemplary embodiment. The power conversion module 30 shown in FIG. 4 differs from the power conversion module 20 shown in FIG. 3 in that a third horizontal routing 305 electrically connecting the first routing area WS1 and the third routing area WS3 is used in place of the second wire WL2. In other words, the first routing area WS1 and the third routing area are integrally formed. According to such a design, the number of wires in the package structure can be reduced, thereby increasing reliability. Moreover, simulation results, under the same simulation conditions, of the simulation tool Q3D extractor show that, when the width W of the third horizontal routing 305 reaches a certain value, the circuit parasitic inductance is the same as that generated by the package structure of the power conversion module 10 shown in FIG. 2A. However, when the width W of the third horizontal routing 305 is smaller than that certain value, the structure generates a circuit parasitic inductance lower than that of the power conversion module 10 shown in FIG. 2A.

Figure 5A:
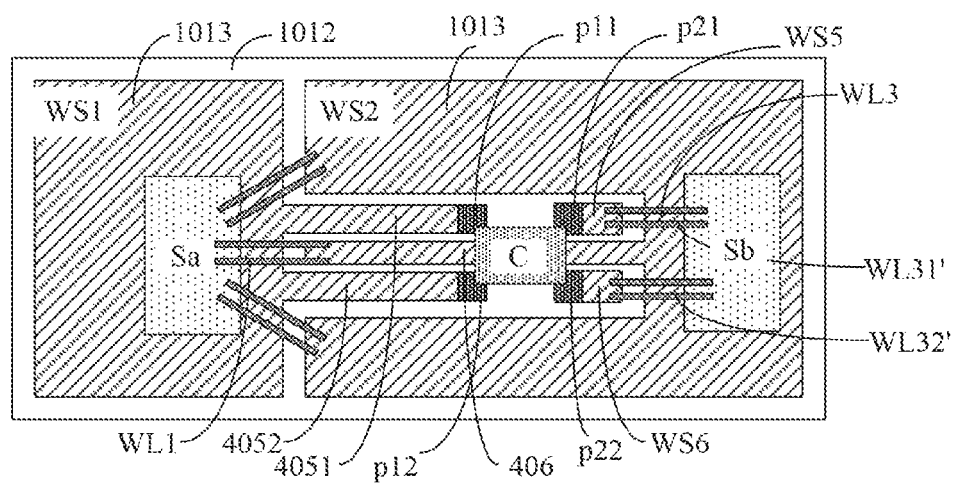
FIGS. 5A and 5B illustrate, respectively, a top view and a current flow direction diagram of a power conversion module according to still another exemplary embodiment.
Figure 5B:
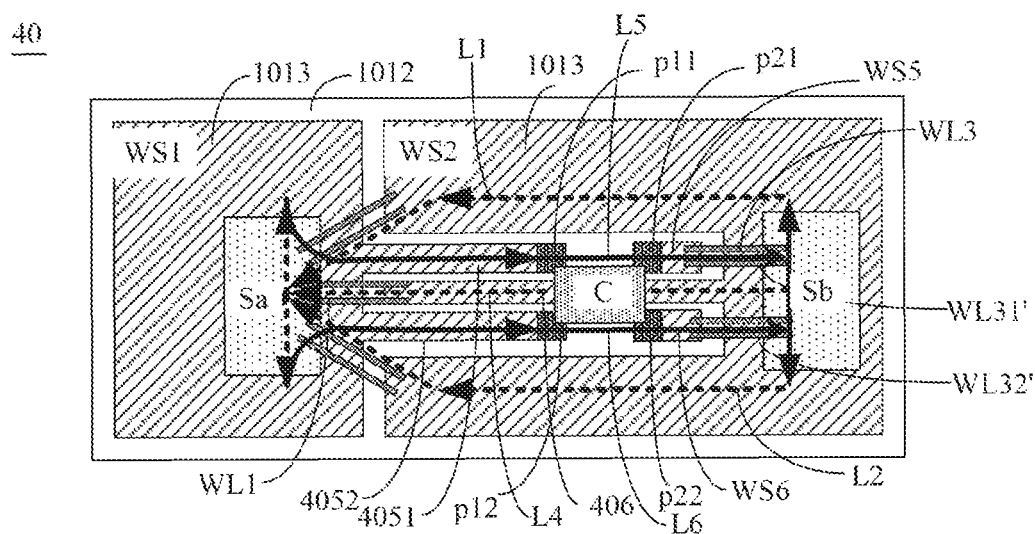

FIGS. 5A and 5B illustrate, respectively, a top view and a current flow direction diagram of a power conversion module according to still another exemplary embodiment. As shown in FIG. 5A, the first terminal of the capacitor C is divided into a first sub-terminal and a second sub-terminal separated from each other, and the second terminal is divided into a third sub-terminal and a fourth sub-terminal separated from each other. In this configuration, the capacitors are preferably of a metal terminal type so as to achieve a divisional connection of the capacitor electrodes. As shown in FIG. 5A, the first routing area WS1 includes a first horizontal routing 4051 and a second horizontal routing 4052. The first sub-terminal and the second sub-terminal are respectively disposed on and electrically connected to the first horizontal routing 4051 and the second horizontal routing 4052 through corresponding connecting material p11 and p12, so that the first terminal of the capacitor C is electrically connected to the first electrode of the electronic device Sa. The routing layer of the substrate 101 further includes a fifth routing area WS5 and a sixth routing area WS6, the third sub-terminal and the fourth sub-terminal are respectively disposed on and electrically connected to the fifth routing area WS5 and the sixth routing area WS6 through corresponding connecting material p21 and p22. The third wire WL3 includes a plurality of portions WL31 'and WL32' corresponding to the fifth routing area WS5 and the sixth routing area WS6, and electrically connecting the fifth routing area WS5 and the sixth routing area WS6, respectively, to and the upper surface electrode of the vertical type power device Sb, so that the second terminal of the capacitor C is electrically connected to the upper surface electrode of the vertical type power device Sb. The second routing area WS2 may further include a fourth horizontal routing 406 when a size of the capacitor allows, and the horizontal routing is electrically connected to the second electrode of the electronic device Sa via the first wire WL1, so as to form a fourth current path LA in the second routing area WS2, which passes through a projection of the capacitor C on the substrate 101. The fourth current path LA is parallel to the first current path L1 and the second current path L2 and have the same current direction, so as to increase the number of routings which have a direction of current flow opposite to that of the capacitor C (as shown in FIG. 5B), increase the degree of inductance cancellation, and further reduce the circuit parasitic inductance. In addition, the third current path L3 in FIG. 2D is divided into a fifth current sub-path L5 and a sixth current sub-path L6 which are parallel to each other and have the same current direction. In other words, the third current path L3 includes the fifth current sub-path L5 and the sixth current sub-path L6 parallel to each other and having the same current direction, while the current direction thereof is opposite to the current direction in the fourth current path L4. In an embodiment, the fifth current sub-path L5 flows through the first horizontal routing 4051 and the fifth routing area WS5, while the sixth current sub-path L6 flows through the second horizontal routing 4051 and the sixth routing area WS6. The simulation results of the simulation tool Q3D extractor show that the circuit parasitic inductance of this structure is significantly reduced compared to that generated in the power conversion module 10 shown by FIG. 2A.

In applications with high power requirements, it is often necessary to achieve high current output capability through parallel connection of the devices.

Figure 6A:
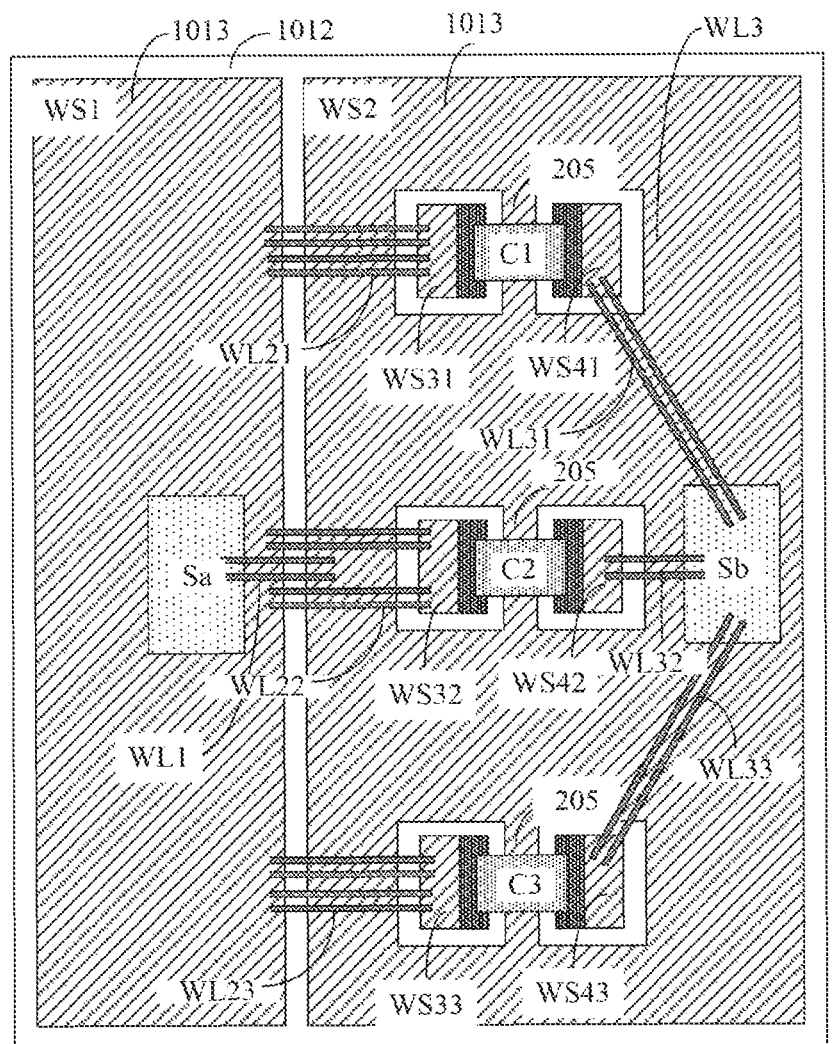
FIGS. 6A and 6B illustrate, respectively, a top view and a circuit diagram of a power conversion module according to still another exemplary embodiment.
Figure 6B:
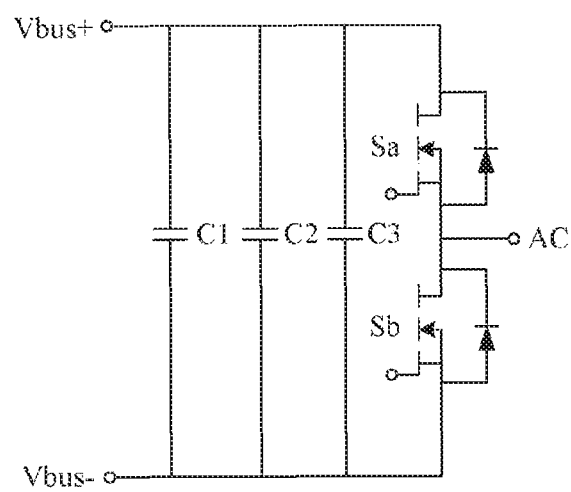

FIGS. 6A and 6B illustrate, respectively, a top view and a circuit diagram of a power conversion module according to still another exemplary embodiment. As shown in FIG. 6B, an example, in which both the electronic device Sa and the vertical type power device Sb are MOSFETs, is taken as an example in the circuit diagram of the power conversion module 50. Unlike the circuit shown in FIG. 2C, the capacitors C1-C3 in the power conversion module 50 are connected in parallel and, then, an end thereof is connected to a positive input terminal Vbus+ and the other end to the negative input terminal Vbus−. Referring to FIG. 6A, the routing layer of the substrate 101 includes a plurality of third routing areas WS31-WS33 and a plurality of fourth routing areas WS41-WS43 corresponding to the plurality of capacitors C1-C3. In FIG. 6A, three capacitors C1-C3 are taken as an example, where they are arranged side-by-side in correspondence to the three third routing areas WS31-WS33 and the three fourth routing areas WS41-WS43. Both terminals of respective one of the capacitors C1-C3 are electrically connected to respective one of the third routing areas WS31-WS33 and respective one of the fourth routing areas WS41-WS43, respectively. The second wire WL2 includes a plurality of portions WL21-WL23 respectively corresponding to the plurality of third routing areas WS31-WS33, for electrically connecting a corresponding one of the third routing areas WS31-WS33 to the first routing area WS1. The third wire WL3 also includes a plurality of portions WL31-WL33 respectively corresponding to the plurality of fourth routing areas WS41-WS43, for electrically connecting a corresponding one of the fourth routing areas WS41-WS43 to the upper surface electrode of the vertical type power device Sb. The ability to absorb input ripple current can be effectively increased in this module due to parallel connections of the capacitors.

Figure 7A:
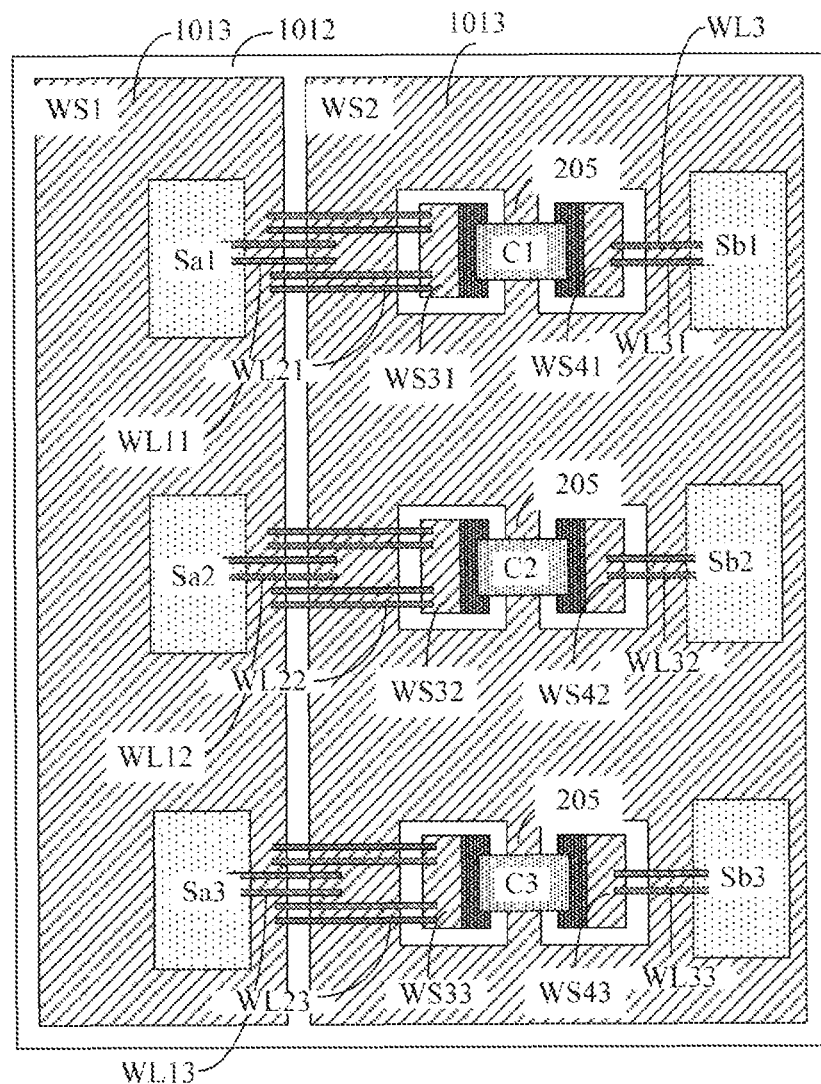
FIGS. 7A and 7B illustrate, respectively, a top view and a circuit diagram of a power conversion module according to yet still another exemplary embodiment.
Figure 7B:
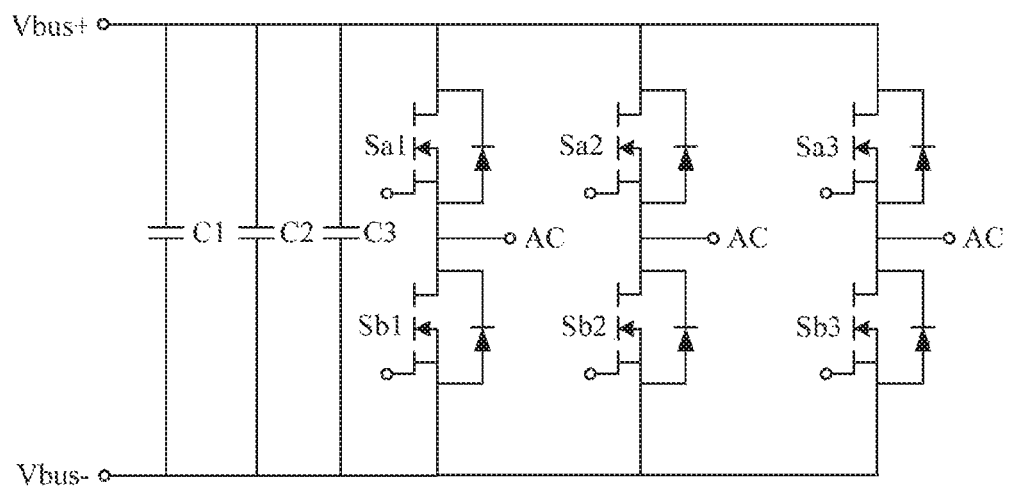

FIGS. 7A and 7B illustrate, respectively, a top view and a circuit diagram of a power conversion module according to yet still another exemplary embodiment. As shown in FIG. 7B, an example, in which both the electronic device Sa and the vertical type power device Sb are MOSFETs, is taken as an example in the circuit diagram of the power conversion module 60. Unlike the circuit shown in FIG. 6B, the power conversion module 60 includes a plurality of electronic devices Sa1-Sa3 and a plurality of vertical type power devices Sb1 to Sb3. In an embodiment, all of drains of the electronic devices Sa1-Sa3 are connected to Vbus+, and sources of the vertical power devices Sb1-Sb3 are all electrically connected to Vbus−, and sources of the electronic devices Sa1-Sa3 are electrically connected to drains of the vertical type power devices Sb1-Sb3, respectively, and AC output pins are led out from the connection points. As shown in FIG. 7A, the plurality of electronic devices Sa1-Sa3 are arranged side by side in the first routing area WS1, the plurality of vertical type power devices Sb1-Sb3 are arranged side by side in the second routing area WS2, the plurality of capacitors C1-C3 are arranged side by side, and both terminals of respective one of the capacitors C1-C3 are distributed in a corresponding one of the third routing areas WS31-WS32 and a corresponding one of the fourth routing areas WS41-WS42, respectively. The first wire WL1 includes a plurality of portions WL11I-WL13, corresponding to the plurality of electronic devices Sa1-Sa3, that electrically connect the second electrodes of the electronic devices Sa1-Sa3 to the second routing area WS2, respectively. The second wire WL2 also includes a plurality of portions WL21-WL23, corresponding to the plurality of third routing areas WS31-WS33, that electrically connected the plurality of third routing areas WS31-WS33 to the first routing area WS1, respectively. The third wire WL3 also includes a plurality of portions WL31 to WL33, corresponding to the plurality of vertical type power devices Sb1-Sb3 and the plurality of fourth routing areas WS41-WS43, that electrically connected the upper surface electrodes of the vertical type power devices Sb1-Sb3 to the plurality of fourth routing areas WS41-WS43, respectively. According to this structure, not only the input ripple absorption capacity of the power conversion module is improved, but also the current output capacity thereof can be increased, so as to enable greater output power.

It should be noted that, the routing patterns of the second routing area WS2, the third routing areas WS31-WS33, and the fourth routing areas WS41-WS43 in FIGS. 6A and 7A are exemplified by the routing pattern of the embodiment shown in FIG. 3. However, the present disclosure is not limited thereto, and the routing pattern according to the embodiments shown in FIGS. 2A, 4, and 5A may also be used.

The present disclosure has been described with respect to the above related embodiments. However, the above-described embodiments are merely examples for carrying out the present disclosure. It is to be noted that the disclosed embodiments do not limit the scope of the present disclosure. On the contrary, modifications and variations that fall within the spirit and scope of the present disclosure are within the scope of the presently disclosed patent.

What is claimed is:

1. A power conversion module, comprising:
a substrate comprising a routing layer and an insulating layer, the routing layer comprising a first routing area and a second routing area;
an electronic device provided on the first routing area and electrically connected to the first routing area and the second routing area, respectively;
a vertical type power device provided on the second routing area and electrically connected to the second muting area; and
a capacitor provided on the substrate, disposed between the electronic device and the vertical type power device, and electrically connected to the electronic device and the vertical type power device, respectively;
wherein a first current path and a second current path are formed in the second routing area, respectively, on both sides of the capacitor, being parallel to each other and having a same current direction; a third current path is formed between the electronic device, the capacitor and the vertical type power device, and the third current path is parallel to the first current path and the second current path with an opposite current direction.

2. The power conversion module according to claim 1, wherein the capacitor comprises a first terminal and a second terminal; the vertical type power device comprises: an upper surface electrode and a lower surface electrode; the electronic device comprises: a first electrode and a second electrode; and wherein the first terminal is electrically connected to the first electrode, the second terminal is electrically connected to the upper surface electrode, and the second electrode is electrically connected to the lower surface electrode.

3. The power conversion module according to claim 2, wherein a connection line between the upper surface electrode and the lower surface electrode is perpendicular to the substrate; the lower surface electrode is electrically connected to the second routing area, and the lower surface electrode is closer to the second routing area than the upper surface electrode.

4. The power conversion module according to claim 3, wherein a connection line between the first electrode and the second electrode is perpendicular to the substrate; the first electrode is electrically connected to the first routing area, and the first electrode is closer to the first routing area than the second electrode.

5. The power conversion module according to claim 4, wherein the second electrode is electrically connected to the second routing area via a first wire.

6. The power conversion module according to claim 5, wherein the first terminal and the second terminal are provided on the insulating layer; and the first terminal is electrically connected to the first routing area via a fourth wire, the second terminal is electrically connected to the upper surface electrode via a fifth wire.

7. The power conversion module according to claim 5, wherein the routing layer further comprises a third routing area and a fourth routing area; the first terminal is provided on the third routing area and is electrically connected to the third routing area, and the third routing area is electrically connected to the first routing area; the second terminal is provided on the fourth routing area and is electrically connected to the fourth routing area, and the fourth routing area is electrically connected to the upper surface electrode via a third wire.

8. The power conversion module according to claim 7, wherein the first routing area and the third routing area are integrally formed.

9. The power conversion module according to claim 8, wherein the second routing area comprises a vertical routing disposed under the capacitor, the vertical routing being provided between the third routing area and the fourth routing area.

10. The power conversion module according to claim 7, wherein the first routing area is electrically connected to the third routing area via a second wire.

11. The power conversion module according to claim 10, further comprising a plurality of the capacitors, a plurality of the third routing areas, and a plurality of the fourth routing areas; wherein a first terminal of each of the capacitors is provided on and electrically connected to a corresponding one of the third routing areas; a second terminal of each of the capacitors is provided on and electrically connected to a corresponding one of the fourth routing areas; the second wire comprises plurality portions, the first routing area is electrically connected to the plurality of the third routing areas via the plurality portions of the second wire; the third wire comprises plurality portions, the upper surface electrode is electrically connected to the plurality of the fourth routing areas via the plurality portions of the third wire.

12. The power conversion module according to claim 10, further comprising a plurality of the capacitors, a plurality of the electronic devices, a plurality of the vertical type power devices, a plurality of the third routing areas, and a plurality of the fourth routing areas; wherein a first terminal of each of the capacitors is provided on and electrically connected to a corresponding one of the third routing areas; a second terminal of each of the capacitors is provided on and electrically connected to a corresponding one of the fourth routing areas; the first wire comprises plurality portions, the second electrode of each of the electronic devices is electrically connected to the second routing area via a corresponding one of the plurality portions of the first wire; the second wire comprises plurality portions, the first routing area is electrically connected to the plurality of the third routing areas via the plurality portions of the second wire; the third wire comprises plurality portions, the upper surface electrode of each of the vertical type power devices is electrically connected to the plurality of the fourth routing areas via the plurality portions of the third wire, respectively.

13. The power conversion module according to claim 10, wherein the second routing area comprises a vertical routing disposed under the capacitor, the vertical routing being provided between the third routing area and the fourth routing area.

14. The power conversion module according to claim 5, wherein first terminal comprises a first sub-terminal and a second sub-terminal separated from each other, the second terminal comprises a third sub-terminal and a fourth sub-terminal separated from each other, the second routing area is further formed with a fourth current path passing through a projection of the capacitor on the substrate, the fourth current path being parallel to the first current path and the second current path with the same current direction.

15. The power conversion module according to claim 14, wherein the first routing area comprises a first horizontal routing and a second horizontal routing; the first sub-terminal and the second sub-terminal are respectively provided on the first horizontal routing and the second horizontal routing, and are electrically connected to the first horizontal routing and the second horizontal routing, respectively; the routing layer further comprises a fifth routing area and a sixth routing area; the third sub-terminal and the fourth sub-terminal are respectively provided on the fifth routing area and the sixth routing area, and are electrically connected to the fifth routing area and the sixth routing area, respectively, the fifth routing area and the six routing area are electrically connected to the upper surface electrode via a third wire, respectively; and wherein the third current path comprises a fifth current sub-path and a sixth current sub-path; the fifth current sub-path and sixth current sub-path are parallel to each other with a same current direction; the fifth current sub-path and the sixth current sub-path are parallel to the fourth current path with an opposite current direction; and wherein the fifth current sub-path flows through the first horizontal routing and the fifth routing area, and the sixth current sub-path flows through the second horizontal routing and the sixth routing area.

16. The power conversion module according to claim 1, wherein the electronic device is any selected from a group comprising a capacitor, a resistor, an inductor and a semiconductor device.

17. The power conversion module according to claim 1, wherein the vertical power device is an IGBT or a MOSFET.

* * * * *